(12) United States Patent
Liao et al.

(10) Patent No.: US 7,772,047 B2
(45) Date of Patent: Aug. 10, 2010

(54) METHOD OF FABRICATING A SEMICONDUCTOR DIE HAVING A REDISTRIBUTION LAYER

(75) Inventors: Chien-Ko Liao, Taichung (TW); Chin-Tien Chiu, Taichung (TW); Jack Chang Chien, Kaoshiung (TW); Cheemen Yu, Madison, WI (US); Hem Takiar, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 586 days.

(21) Appl. No.: 11/769,927

(22) Filed: Jun. 28, 2007

(65) Prior Publication Data

US 2009/0004781 A1 Jan. 1, 2009

(51) Int. Cl.
*H01L 21/82* (2006.01)

(52) U.S. Cl. .............. 438/132; 438/215; 438/281; 438/333; 438/467; 438/468; 438/469; 438/470; 438/601; 438/598; 438/669; 438/118; 438/119; 430/120.4; 430/124.31; 430/124.4; 29/839; 29/840; 29/878; 29/879; 257/209; 257/529; 257/530; 257/E21.506; 257/E21.514; 257/E23.171

(58) Field of Classification Search .............. 438/598, 438/669, 118, 119, 132, 215, 281, 333, 467–470, 438/601; 257/E21.506, E21.514, E23.171, 257/209, 529, 530; 430/120.4, 124.31, 124.4; 29/839–840, 878–879
See application file for complete search history.

(56) References Cited

U.S. PATENT DOCUMENTS

| | | | | |
|---|---|---|---|---|
| 3,891,441 A | * | 6/1975 | Tsuji et al. | 430/273.1 |
| 4,123,578 A | * | 10/1978 | Perrington et al. | 428/206 |
| 4,291,114 A | * | 9/1981 | Berggren et al. | 430/253 |
| 4,454,179 A | * | 6/1984 | Bennett et al. | 428/40.8 |
| 4,511,641 A | * | 4/1985 | Busman et al. | 430/158 |
| 4,999,076 A | * | 3/1991 | Incremona et al. | 156/241 |
| 5,328,798 A | * | 7/1994 | McCarthy et al. | 430/200 |
| 5,342,731 A | * | 8/1994 | Kelly et al. | 430/253 |
| 5,444,301 A | | 8/1995 | Song et al. | |
| 5,783,464 A | * | 7/1998 | Burns | 438/112 |
| 5,786,062 A | * | 7/1998 | Callahan et al. | 428/100 |
| 5,950,304 A | * | 9/1999 | Khandros et al. | 29/831 |

(Continued)

OTHER PUBLICATIONS

International Search Report and Written Opinion dated Feb. 12, 2009 in PCT Application No. PCT/US2008/068542.

(Continued)

*Primary Examiner*—Fernando L Toledo
*Assistant Examiner*—Ankush K Singal
(74) *Attorney, Agent, or Firm*—Vierra Magen Marcus & DeNiro LLP

(57) ABSTRACT

A semiconductor device having a redistribution layer, and methods of forming same, are disclosed. After fabrication of semiconductor die on a wafer, a tape assembly is applied onto a surface of the wafer, in contact with the surfaces of each semiconductor die on the wafer. The tape assembly includes a backgrind tape as a base layer, and a film assembly adhered to the backgrind tape. The film assembly in turn includes an adhesive film on which is deposited a thin layer of conductive material. The redistribution layer pattern is traced into the tape assembly, using for example a laser. Thereafter, the unheated portions of the tape assembly may be removed, leaving the heated redistribution layer pattern on each semiconductor die.

34 Claims, 4 Drawing Sheets

U.S. PATENT DOCUMENTS

| | | | |
|---|---|---|---|
| 6,011,314 A | 1/2000 | Leibovitz et al. | |
| 6,444,498 B1 * | 9/2002 | Huang et al. | 438/126 |
| 6,540,345 B1 * | 4/2003 | Wagner et al. | 347/103 |
| 6,566,234 B1 * | 5/2003 | Capote et al. | 438/458 |
| 6,706,557 B2 | 3/2004 | Koopmans | |
| 6,822,376 B2 * | 11/2004 | Baumgartner | 310/365 |
| 6,897,096 B2 * | 5/2005 | Cobbley et al. | 438/123 |
| 7,105,930 B2 * | 9/2006 | Lua et al. | 257/778 |
| 2001/0020745 A1 * | 9/2001 | Jiang et al. | 257/778 |
| 2003/0160330 A1 * | 8/2003 | McTeer | 257/762 |
| 2003/0183945 A1 * | 10/2003 | Park | 257/777 |
| 2004/0004001 A1 * | 1/2004 | Cohen et al. | 205/118 |
| 2004/0159462 A1 | 8/2004 | Chung | |
| 2004/0191955 A1 | 9/2004 | Joshi et al. | |
| 2004/0221451 A1 * | 11/2004 | Chia et al. | 29/854 |
| 2007/0001293 A1 * | 1/2007 | Jiang et al. | 257/720 |
| 2007/0141330 A1 * | 6/2007 | Morishima et al. | 428/343 |
| 2007/0296082 A1 * | 12/2007 | Cho | 257/737 |
| 2008/0105557 A1 * | 5/2008 | Cohen et al. | 205/157 |
| 2008/0220566 A1 * | 9/2008 | Hsieh et al. | 438/118 |
| 2008/0237909 A1 * | 10/2008 | Bech | 264/101 |
| 2008/0251947 A1 * | 10/2008 | Sakata et al. | 257/783 |
| 2008/0315375 A1 * | 12/2008 | Eichelberger et al. | 257/659 |

OTHER PUBLICATIONS

U.S. Appl. No. 11/769,937, filed Jun. 28, 2007.
Response to Office Action filed Jan. 19, 2010 in U.S. Appl. No. 11/769,937.
Office Action dated Aug. 19, 2009 in U.S. Appl. No. 11/769,937.
Notice of Allowance and Fee(s) Due dated Mar. 22, 2010 in U.S. Appl. No. 11/769,937.

* cited by examiner

METHOD OF FABRICATING A SEMICONDUCTOR DIE HAVING A REDISTRIBUTION LAYER

CROSS-REFERENCE TO RELATED APPLICATION

The following application is cross-referenced and incorporated by reference herein in its entirety:
U.S. patent application Ser. No. 11/769,937, entitled "Semiconductor Die Having Redistribution Layer," by Andrew Liao, et al., filed on even date herewith.

BACKGROUND OF THE INVENTION

1. Field of the Invention

Embodiments of the present invention relate to a redistribution layer for a semiconductor device and methods of forming same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound to provide a protective package.

A top view of a conventional semiconductor package 20 (without molding compound) is shown in FIG. 1. Typical packages include a plurality of semiconductor die, such as die 22 and 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. Both die are then electrically coupled to the substrate by affixing wire bonds 32 between respective die bond pad 28 and contact pad 30 pairs.

Space within the semiconductor package is at a premium. Semiconductor die are often formed with bond pads along two adjacent sides, such as shown on die 24 in FIG. 1. However, owing to the significant real estate limitations, there may only be room on the substrate for a wire bond connection along one edge of the die. Thus, in FIG. 1, there are no contact pads along edge 34 of substrate 26 for connecting with die bond pads 28a.

One known method of handling this situation is through the use of a redistribution layer formed on a semiconductor die. After a semiconductor die is fabricated and singulated from the wafer, the die may undergo a process where electrically conductive traces and bond pads (traces 38 and bond pads 40, FIG. 1) are formed on the top surface of the die. Once formed, the traces 38 and bond pads 28a may be covered with an insulator, leaving only the newly formed die bond pads 40 exposed. The traces 38 connect the existing die bond pads 28a with the newly formed die bond pads 40 to effectively relocate the die bond pads to an edge of the die having a pin-out connection to the substrate. Additional contact pads 30 may be formed on the substrate to allow electrical connection between the substrate and the bond pads 28a. The additional contact pads 30 may be formed in-line with the remaining contact pads 30 as shown in prior art FIG. 1. Alternatively, where there is available space, the additional contact pads 30 may be staggered with the remaining contact pads as shown in prior art FIG. 2.

Current photolithography and other methods for forming a redistribution layer on semiconductor die are cumbersome, adding large numbers of process steps and expense to the fabrication process. There is therefore a need for a streamlined process for forming a redistribution layer.

SUMMARY OF THE INVENTION

Embodiments of the present invention relate to a semiconductor device having a redistribution layer and methods of forming same. In an embodiment, after fabrication of semiconductor die on a wafer, a tape assembly is applied onto a surface of the wafer, in contact with the surfaces of each semiconductor die on the wafer. The tape assembly includes a backgrind tape as a base layer, and a film assembly adhered to the backgrind tape. The film assembly in turn includes an adhesive film on which is deposited a thin layer of conductive material.

The tape assembly is applied to the surface of the wafer so that the adhesive layer of the film assembly lies in contact with the surface of the wafer. When applied to the wafer. The adhesive is a b-stage adhesive which adheres to the wafer, but which is pliable and can be removed.

After the tape assembly is applied to the surface of the semiconductor wafer, focused heat, such as for example from a laser, is applied to the interface between the tape assembly and the wafer. The laser is programmed to focus its energy at the interface between the adhesive layer and the surface of the semiconductor wafer. At locations along the interface where the laser is applied, the adhesive layer is heated and cured to the surface of the semiconductor wafer so as to be permanently affixed to the semiconductor wafer along the path traced by the laser where heat is applied.

The path of the laser is computer-controlled so as to trace out, on each semiconductor die, the pattern of the redistribution layer to be defined on each semiconductor die. By selectively focusing heat at the interface between the tape assembly and the wafer, the adhesive layer of the tape assembly may be fused to the surface of each semiconductor die along a thin and sharply defined path. The adhesive layer on either side of the paths defined by the focused heat remains in the b-stage, or otherwise uncured, and may be peeled away from the surface of the wafer while those areas which have been fused remain on the wafer surface. Accordingly, as the tape assembly is pulled away from the wafer, the heated areas of the film assembly tear away from the areas of film assembly which are not heated, and the heated areas of film assembly are left behind on the surfaces of each semiconductor die to define a redistribution layer pattern on each semiconductor die.

DETAILED DESCRIPTION

Embodiments of the present invention will now be described with reference to FIGS. 3 through 12, which relate to a multiple die redistribution layer for a semiconductor device and methods of forming same. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
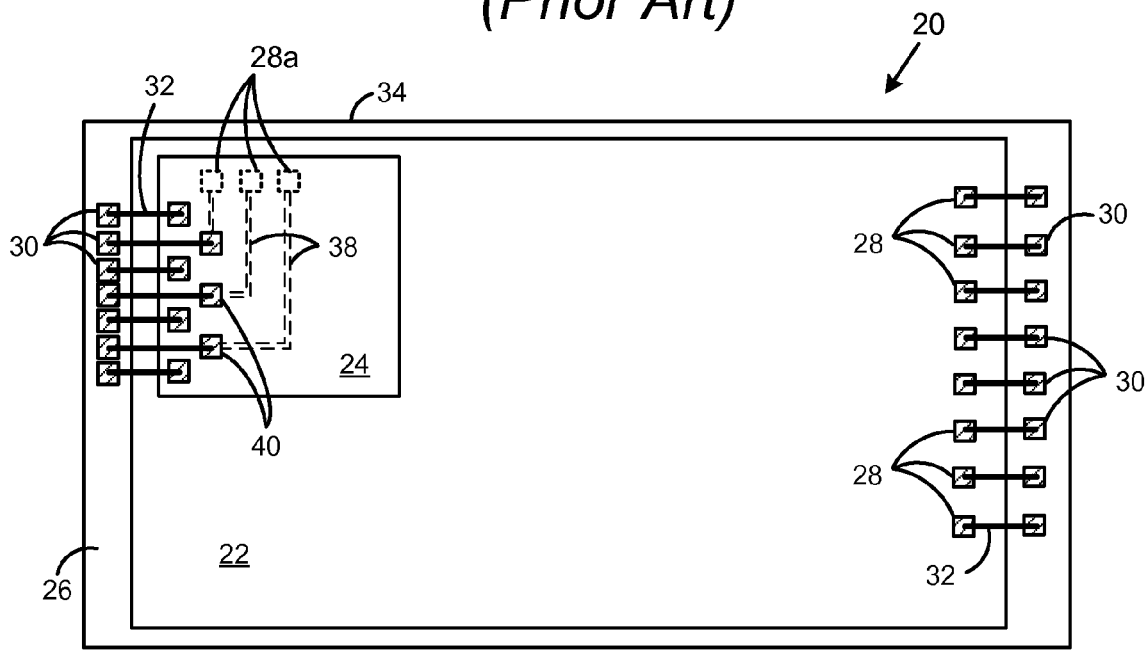
FIG. 1 is a top view of a conventional semiconductor package including a semiconductor die having a redistribution layer to redistribute die bond pads from a first edge to a second edge of the die.
Figure 2:
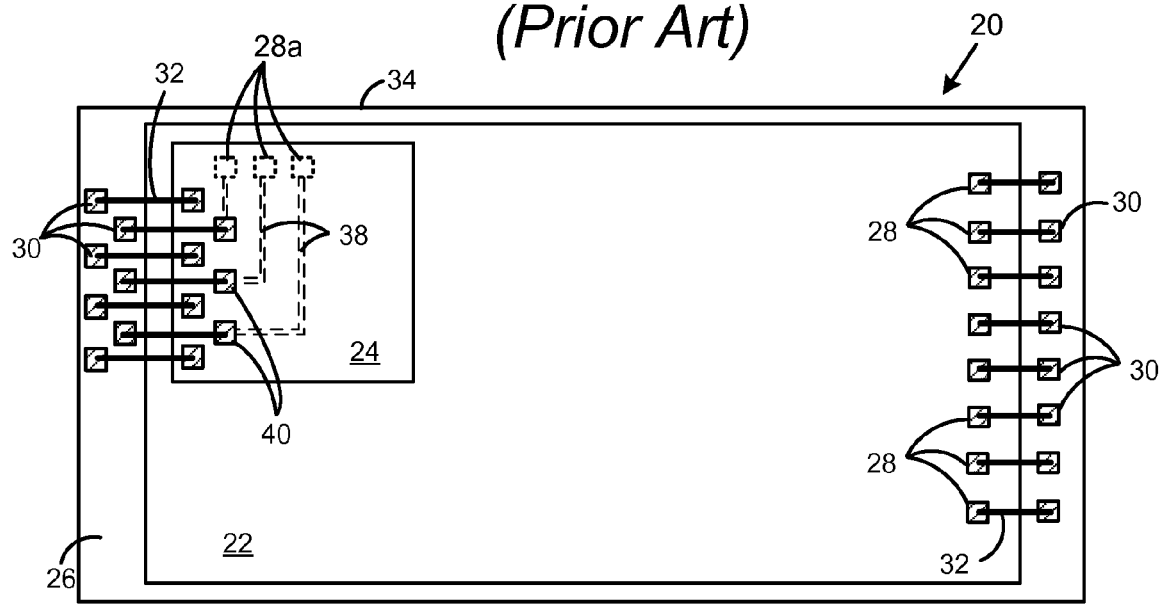
FIG. 2 is a top view of a conventional semiconductor package including a die having a redistribution layer as in FIG. 1 with an alternative substrate contact pad arrangement.
Figure 3:
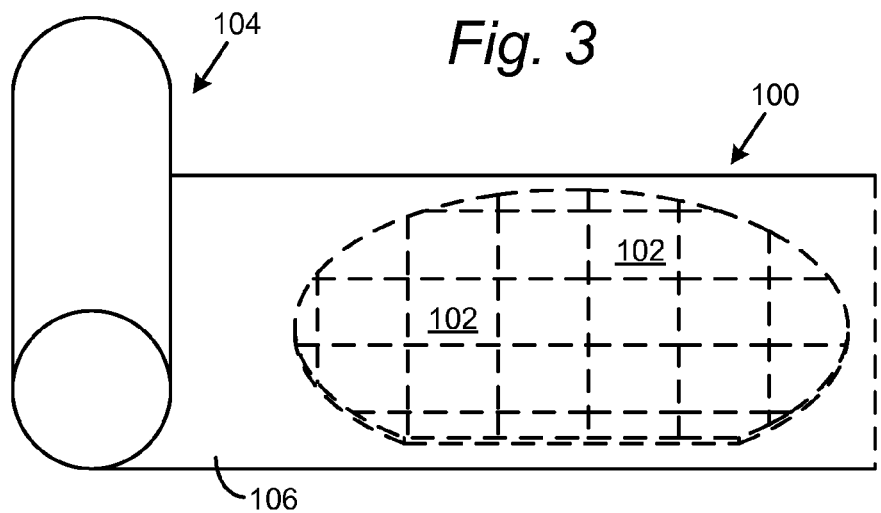
FIG. 3 is a perspective view of a semiconductor wafer covered by a tape assembly from a roll of tape according to embodiments of the present invention.

Referring now to FIG. 3, there is shown a top view of a semiconductor wafer 100 including a plurality of semiconductor die 102 (only some of which are numbered in FIG. 3). Each semiconductor die 102 on wafer 100 has been processed to include an integrated circuit as is known in the art capable of performing a specified electronic function. All of semiconductor die 102 on wafer 100 may have the same integrated circuit, though it is contemplated that different die may have different integrated circuits in alternative embodiments. As is known in the art, the respective integrated circuits may be tested during wafer fabrication to identify defective or bad die.

Upon completion of wafer fabrication testing, normally each of the die 102 would be singulated into individual die and thereafter assembled into a semiconductor package. However, according to an embodiment of the present invention, each semiconductor die may have a redistribution layer formed thereon as explained below. FIG. 3 further shows a roll 104 including a tape assembly 106 for forming the redistribution layer on the respective die 102 of wafer 100. The tape assembly 106 may have a width sufficient to be applied over the entire surface of wafer 100 as shown in FIG. 3. It is alternatively contemplated that tape assembly 106 has a width sufficient to cover only a single row of semiconductor die 102 on wafer 100 or two or more rows of semiconductor die 102.

Figure 4:
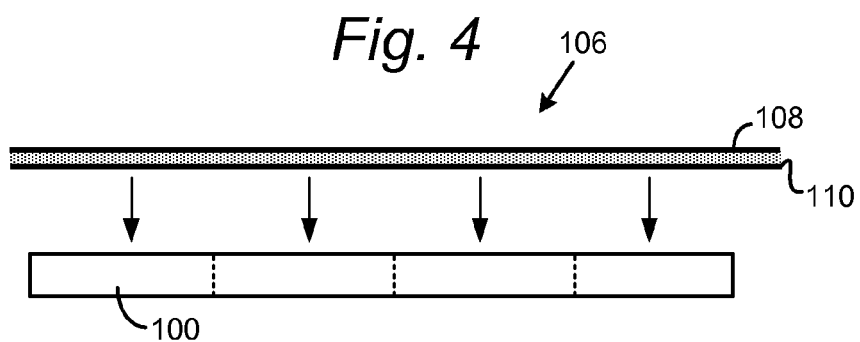
FIG. 4 is a side view of a tape assembly being placed over semiconductor die of a semiconductor wafer according to embodiments of the present invention.
Figure 5:
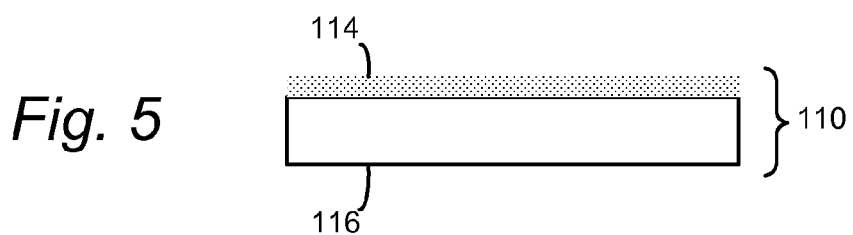
FIG. 5 is a side view of a film assembly including an adhesive layer and conductive material according to embodiments of the present invention.

Referring to the side view of FIG. 4, tape assembly 106 includes a polyimide tape 108, referred to as a backgrind tape as is known in the art, to which is affixed a film assembly 110. As shown in FIG. 5, film assembly 110 includes an adhesive layer 116 on which is deposited a conductive material 114. Adhesive material 116 may be any of a variety of known electrically insulating adhesive films, such as for example those available from Nitto Denko Corp. of Japan, Abel Stick Co., California or Henkel Corporation, California. Adhesive material 116 may for example be a curable b-stage adhesive which is sticky and pliable prior to being applied to wafer 100 and prior to being cured.

Conductive material 114 may be a variety of electrical conductors, such as for example aluminum, titanium, or alloys thereof. Conductive material 114 may be applied to the surface of adhesive layer 116 by a variety of known methods including for example sputtering, plating, screen printing, photolithographic processes, or a variety of other deposition processes. Such processes allow conductive material 114 to be applied with a very small thickness, such as for example between 1 and 5 microns, and more particularly between 1 and 3 microns. It is understood that the thickness of the conductive material 114 on adhesive layer 116 may be less than 1 micron and greater than 5 microns in alternative embodiments of the present invention.

Figure 6:
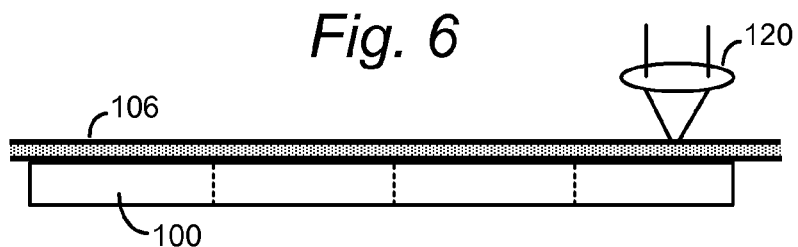
FIG. 6 is a side view of a tape assembly affixed to semiconductor die of a semiconductor wafer and further including a laser tracing a redistribution pattern into the surface of the tape assembly.

Once film assembly 110 is formed, the film assembly is applied to backgrind tape 108 to form tape assembly 106. Tape 108 may also have an adhesive surface for adhering the conductive material 114 of the film assembly 110 to the backgrind tape 108. As seen in FIGS. 3, 4 and 6, tape assembly 106 is applied onto semiconductor wafer 100 so that the adhesive layer 116 of tape assembly 106 is applied to the surfaces of the semiconductor die 102 on wafer 100. In the state which adhesive layer 116 is applied to the semiconductor wafer 100, the adhesive layer 116 is sticky and adheres to the surface of wafer 100. However, the adhesive layer 116 is not yet cured and, in this stage, the adhesive layer 116 may be pulled away from the surface of wafer 100.

In embodiments, after the tape assembly 106 is applied to the wafer, the backgrind tape 108 may be thinned in a backgrind process to thin the tape assembly 106. The backgrind process may be omitted in alternative embodiments.

Referring now to the side view of FIG. 6, after the tape assembly 106 is applied to the surface of semiconductor wafer 100, focused heat is applied to the interface between tape assembly 106 and the wafer 100 (and in particular, the interface between adhesive layer 116 and the surface of wafer 100). In embodiments, this focused heat may be applied by one of a variety of lasers 120, including for example CO2 lasers, UV lasers, YBO4 lasers, argon lasers, etc. Such lasers are manufactured for example by Rofin-Sinar Technologies of Hamburg, Germany. The laser is programmed to focus its energy at the interface between adhesive layer 116 and the surface of the semiconductor wafer 100. At locations along the interface where the laser is applied, the adhesive layer 116 is heated and cured to the surface of the semiconductor wafer so as to be permanently affixed to the semiconductor wafer along the path traced by the laser where heat is applied.

Figure 7:
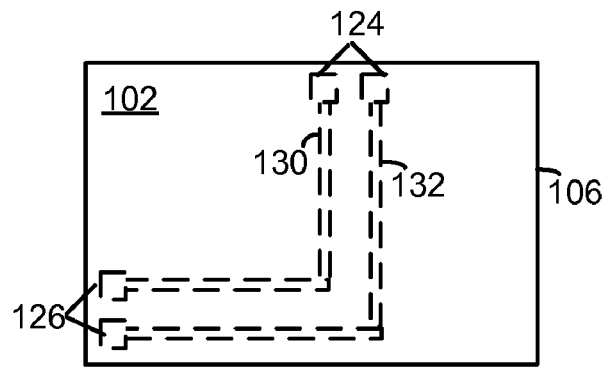
FIG. 7 is a top view of a semiconductor die with the tape assembly positioned thereon and the redistribution layer pattern lased into the tape assembly.

The path of the laser is computer-controlled so as to trace out, on each semiconductor die 102, the pattern of the redistribution layer to be defined on each semiconductor die 102. For example, as shown in FIG. 7, it may be desirable to redistribute a first pair of die bond pads 124 along the top edge of semiconductor die 102 to a pair of die bond pads 126 along an adjacent edge of semiconductor die 102. Accordingly, laser 120 will trace out the redistribution layer pattern including paths 130 and 132 on tape assembly 106 as shown in dash lines in FIG. 7. It is understood that paths 130 and 132 are by way of example only, and a wide variety of redistribution layer patterns may be traced out by laser 120 to redistribute die bond pads from a first location on each of the semiconductor die 102 to a second location on each of the semiconductor die 102. While a single laser 120 is shown in FIG. 6, it is understood that a plurality of lasers 120 may be used to simultaneously trace out the redistribution layer pattern on a plurality of semiconductor die.

Figure 8:
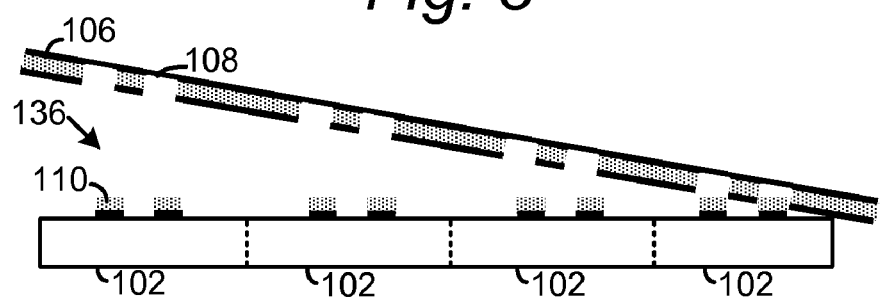
FIG. 8 is a side view of the tape assembly being removed from a semiconductor wafer, leaving behind the redistribution layer pattern traced by the laser.

By selectively focusing heat at the interface between the tape assembly 106 and wafer 100, as for example by laser 120, the adhesive layer 116 of tape assembly 106 may be fused to the surface of each semiconductor die 102 along a thin and sharply defined path. Significantly, the adhesive layer 116 on either side of the paths defined by the focused heat remains in the b-stage, or otherwise uncured, and may be peeled away from the surface of the wafer 100 as shown in FIG. 8, while those areas which have been fused remain on the wafer surface.

In those areas of tape assembly 106 not heated by the laser 120, the attractive force between film assembly 110 and the backgrind tape 108 of tape assembly 106 exceeds the attractive force between the film assembly 110 and the surface of the semiconductor wafer 100. Thus, upon peeling away the backgrind tape 108, the unheated areas of film assembly 110 are pulled away with the tape assembly 106. Conversely, for those areas heated by the laser, the attractive force between film assembly 110 and tape 108 is exceeded by the attractive force between the film assembly 110 and the surface of the semiconductor wafer 100. Accordingly, as shown in FIG. 8, as tape assembly 106 is pulled away from wafer 100, the heated areas of film assembly 110 tear away from the areas of film assembly which are not heated, and the heated areas of film assembly are left behind on the surfaces of each semiconductor die 102 to define a redistribution layer pattern 136 on each semiconductor die 102.

Figure 9:
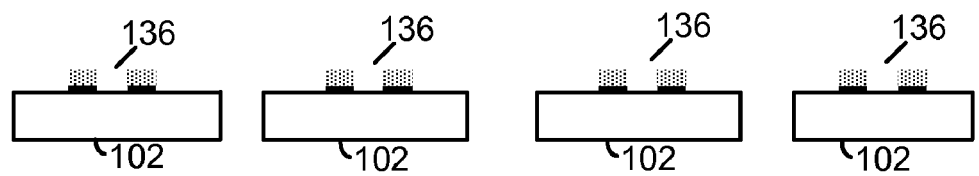
FIG. 9 shows a plurality of semiconductor die singulated from the wafer.
Figure 10:
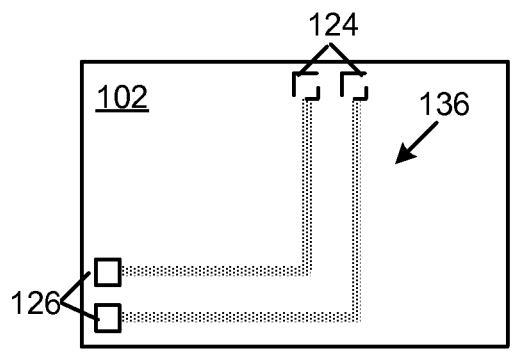
FIG. 10 is a top view of a singulated die including a redistribution layer formed according to embodiments of the present invention.

Referring now to FIGS. 9 and 10, after the uncured portions of tape assembly 106 are removed from the semiconductor wafer 100, the wafer 100 is singulated into individual semiconductor die 102, each of which includes the redistribution layer pattern 136 as defined by the heat source. FIG. 10 is a top view of a singulated semiconductor die 102 including a redistribution layer pattern 136 for redistributing die bond pads 124 at the top of the die to die bond pads 126 along the adjacent edge of the die. In embodiments, the adhesive layer 116 on the surface of the semiconductor die is an electrical insulator. Thus, the further step of electrically coupling the conductive material 114 to the die bond pads 124 and 126 is next performed. A variety of processes are known for electrically coupling the conductive material of redistribution layer pattern 136 to die bond pads 124 and 126. After the pattern is electrically coupled to die bond pads 124 and 126, a passivation layer may be formed on the surface of semiconductor die 102 as is known to cover the exposed redistribution layer pattern 136 and, optionally, die bond pads 124. Die bond pads 126 remain exposed.

Figure 11:
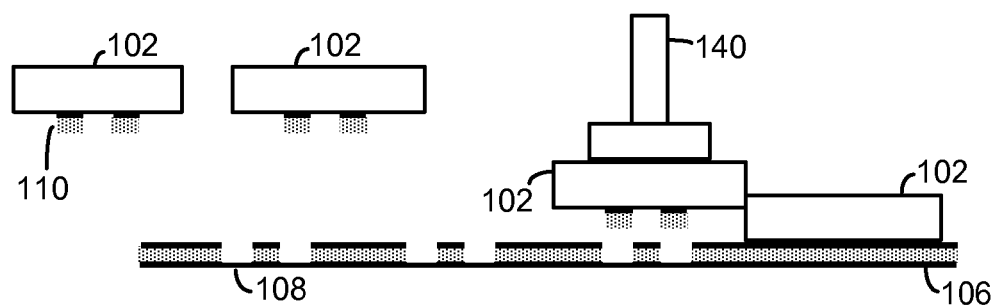
FIG. 11 is a side view of an alternative method of separating the semiconductor die from the new tape assembly.

FIG. 11 illustrates an alternative method for forming a redistribution layer on die 102. Tape assembly 106 is applied to wafer 100, and a heat source such as a laser traces out the redistribution layer pattern 136 on each of the semiconductor die 102, as described above. However, in the embodiment shown in FIG. 11, at some point either before or after the tape assembly 106 is applied, the semiconductor wafer 100 is flipped over and is supported by the tape assembly 106 on a wafer chuck or the like. According to the embodiment of FIG. 11, the die 102 are singulated while still in contact with tape assembly 106. Thereafter, a robotic device 140, such as a pick and place robot, grips the back side of each semiconductor die 102 and pulls the respective die 102 away from tape assembly 106. As described above, those areas of the film assembly 110 which have been heated and fused to the surface of the respective semiconductor die 102 tear away from the backgrind tape 108 and remain with the semiconductor die 102 when robotic device 140 pulls the singulated die 102 away from tape assembly 106. The unheated portions of the film assembly 110 remain on tape assembly 106, on the wafer chuck.

Figure 12:
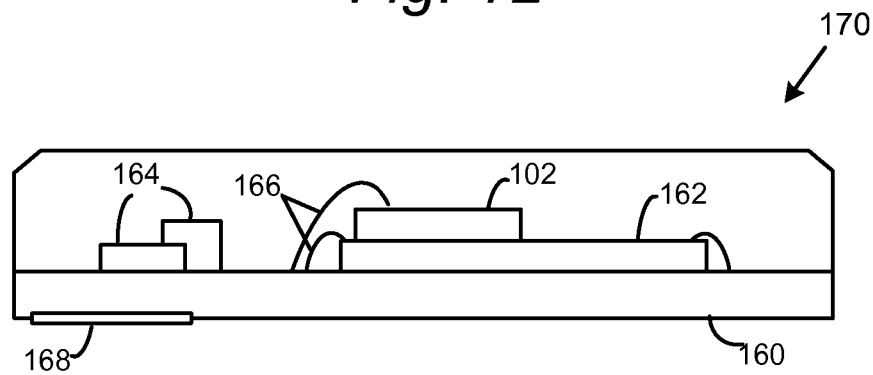
FIG. 12 is a cross-sectional side view of a semiconductor package including a semiconductor die having a redistribution layer formed according to embodiments of the present invention.

It is understood that using the above-described redistribution layer process steps, one or more die bond pads may be redistributed from any first location to any second location on a semiconductor die 102 by a redistribution layer across the die formed at the wafer level. Referring now to FIG. 12, at the completion of the above-described steps, the die 102 may be mounted on a substrate 160. The die 102 may be the only die mounted on a substrate 160, or the die 102 may be mounted on substrate 160 along with one or more additional die 162 and passive components 164 as shown in FIG. 12. Thereafter, the die bond pads on die 102, and any other die, may be wire bonded to contact pads on substrate 160 using wire bonds 166 in a known wire bond process. In embodiments, the die and substrate together may function as a flash memory device 170, where die 102 may be a controller such as an ASIC or a flash memory die. The die 102 may be other than a controller or flash memory die in alternative embodiments, and the die and substrate together may be other than a flash memory device in alternative embodiments. In embodiments where the flash memory device 170 is a portable memory device, contact fingers 168 may further be provided on substrate 160 for exchanging signals between the device 170 and a host device within which the device 170 is inserted.

As explained in the Background of the Invention, in some package configurations, there is room for pin-out locations only along a single edge of a semiconductor die. The redistribution layer applied to semiconductor die 102 effectively redistributes the bond pads on the surface of the die 102 to where they can be easily bonded to substrate 160. The relative lengths and relative widths of the semiconductor die 102, semiconductor die 162 and substrate 160 shown in FIG. 12 is by way of example only and may vary widely in alternative embodiments of the present invention.

As shown in FIG. 12, after forming the stacked die configuration according to the above described embodiments, the individual semiconductor packages may be encased within the molding compound 168 to form a finished semiconductor die package 170. Molding compound 168 may be a known epoxy such as for example available from Sumitomo Corp. and Nitto Denko Corp., both having headquarters in Japan. The package 170 shown in FIG. 12 may be a finished portable memory card. Alternatively, the package 170 may be enclosed within a lid to form the completed portable memory card.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of fabricating a semiconductor package from a semiconductor wafer, the semiconductor package including a semiconductor die having a redistribution layer, the method comprising the steps of:
   (a) applying a tape assembly over at least portions of the semiconductor wafer, the tape assembly including a tape, an adhesive layer and conductive material applied to the adhesive layer, the adhesive layer positioned adjacent the semiconductor wafer;
   (b) adhering portions of the adhesive layer to a surface of the semiconductor die on the semiconductor wafer in a pattern defining a path between a first location of a die bond pad of the semiconductor die and a second location where the die bond pad is to be redistributed; and
   (c) removing portions of the tape assembly, leaving behind adhered to the semiconductor wafer the pattern of the adhesive layer defined in said step (b) and the conductive material applied to the pattern of the adhesive layer defined in said step (b).

2. A method as recited in claim 1, wherein said step (b) of adhering portions of the adhesive layer to a surface of the semiconductor die comprises the step of heating an interface between the adhesive layer and the surface of the semiconductor die along the pattern defining the path between the first and second locations.

3. A method as recited in claim 1, wherein said step (c) of removing portions of the tape assembly comprises the step of pulling away the portions of the tape assembly.

4. A method as recited in claim 1, wherein said step (c) of removing portions of the tape assembly comprises the step of pulling away the tape.

5. A method as recited in claim 1, wherein said step (c) of removing portions of the tape assembly comprises the step of severing portions of the adhesive layer adhered to the surface of a semiconductor die in said step (b) from portions of the adhesive layer not adhered to the surface of a semiconductor die in said step (b).

6. A method as recited in claim 1, further comprising forming the tape assembly by the steps of:
   (d) depositing the conductive material on the adhesive layer; and
   (e) applying the adhesive layer and conductive material to the tape.

7. A method as recited in claim 1, further comprising the step (f) of electrically coupling the first die bond pad to an end of the conductive material left in said step (c).

8. A method as recited in claim 1, further comprising the step (h) of singulating the semiconductor die from the semiconductor wafer after said step (c) of removing portions of the tape assembly.

9. A method as recited in claim 2, wherein said step of heating an interface between the adhesive layer and the surface of the semiconductor die along the pattern defining the path between the first and second locations comprises the step of heating the interface with a laser.

10. A method as recited in claim 4, wherein said step (c) of removing portions of the tape assembly further comprises the step of pulling away, with the tape, portions of the conductive material and adhesive layer not adhered to the surface of a semiconductor die in said step (b).

11. A method as recited in claim 6, said step (d) of depositing the conductive material on the adhesive layer comprising the step of sputtering the conductive material on the adhesive layer.

12. A method as recited in claim 6, said step (d) of depositing the conductive material on the adhesive layer comprising the step of depositing at least one of titanium and aluminum onto the adhesive layer.

13. A method as recited in claim 6, said step (d) of depositing the conductive material on the adhesive layer comprising the step of depositing the conductive material on the adhesive layer to a thickness of between 1 and 5 microns.

14. A method as recited in claim 12, further comprising the step (g) of electrically coupling a second end of the conductive material left in said step (c) to a second die bond pad at the second location.

15. A method as recited in claim 8, further comprising the step (i) of mounting the semiconductor die on a substrate.

16. A method as recited in claim 15, further comprising the step (j) of electrically coupling the semiconductor die to the substrate.

17. A method as recited in claim 8, wherein said step (j) of electrically coupling the semiconductor die to the substrate comprises the step of electrically coupling a wire bond between the semiconductor die at the second location and the substrate.

18. A method as recited in claim 8, further comprising the step (k) of encapsulating the semiconductor die and at least portions of the substrate.

19. A method of fabricating a semiconductor package from a semiconductor wafer, the semiconductor package including a semiconductor die having a redistribution layer, the method comprising the steps of:
   (a) applying a tape assembly over at least portions of the semiconductor wafer, the tape assembly including a tape, and a film assembly including an adhesive layer and conductive material applied to the adhesive layer;
   (b) defining a pattern in the film assembly where the attractive force between the semiconductor wafer and the film assembly is increased; and
   (c) removing portions of the tape assembly, leaving behind adhered to the semiconductor wafer the pattern defined in the film assembly in said step (b).

20. A method as recited in claim 19, wherein said step (b) of defining a pattern in the film assembly comprises the step of heating an interface between the adhesive layer and the surface of the semiconductor wafer along the pattern.

21. A method as recited in claim 19, wherein said step (c) of removing portions of the tape assembly comprises the step of pulling away the portions of the tape assembly.

22. A method as recited in claim 19, wherein said step (c) of removing portions of the tape assembly comprises the step of severing the pattern of adhesive film defined in said step (b) from portions of the adhesive film around the pattern.

23. A method as recited in claim 19, further comprising the step (d) of singulating the semiconductor die from the semiconductor wafer after said step (c) of removing portions of the tape assembly.

24. A method as recited in claim 20, wherein said step of heating an interface between the adhesive layer and the surface of the semiconductor wafer comprises the step of heating the interface with a laser.

25. A method as recited in claim 23, further comprising the step (e) of mounting the semiconductor die on a substrate.

26. A method as recited in claim 25, further comprising the step (f) of electrically coupling the semiconductor die to the substrate.

27. A method as recited in claim 26, wherein said step (f) of electrically coupling the semiconductor die to the substrate comprises the step of electrically coupling a die bond pad on the semiconductor die and the substrate via a wire bond and the conductive material of the pattern defined in said step (b).

28. A method as recited in claim 26, further comprising the step (g) of encapsulating the semiconductor die and at least portions of the substrate.

29. A method of fabricating a semiconductor package from a semiconductor wafer, the semiconductor package including a semiconductor die having a redistribution layer, the method comprising the steps of:
  (a) forming a tape assembly by the steps of:
    (a1) depositing the conductive material on the adhesive layer to form a film assembly, and
    (a2) applying the film assembly onto a tape;
  (b) applying the tape assembly over at least portions of the semiconductor wafer with the film assembly in contact with a surface of the semiconductor wafer; and
  (c) defining a redistribution pattern on a surface of the semiconductor wafer by the steps of:
    (c1) lasing a pattern in the film assembly to augment the attractive force between the semiconductor wafer and the film assembly in the area of the pattern, and
    (c2) removing portions of the tape assembly, leaving behind adhered to the semiconductor wafer the pattern defined in the film assembly of said step (c1).

30. A method as recited in claim 29, said step (a1) of depositing the conductive material on the adhesive layer comprising the step of sputtering the conductive material on the adhesive layer.

31. A method as recited in claim 29, said step (a1) of depositing the conductive material on the adhesive layer comprising the step of depositing at least one of titanium and aluminum onto the adhesive layer.

32. A method as recited in claim 29, said step (a1) of depositing the conductive material on the adhesive layer comprising the step of depositing the conductive material on the adhesive layer to a thickness of between 1 and 5 microns.

33. A method as recited in claim 29, wherein said step (c2) of removing portions of the tape assembly comprises the step of pulling away the portions of the tape assembly.

34. A method as recited in claim 33, wherein said step (c1) of lasing a pattern in the film assembly to augment the attractive force between the semiconductor wafer and the film assembly in the area of the pattern comprises the step of augmenting the attractive force between the semiconductor wafer and the film assembly in the area of the pattern to exceed the attractive force between the film assembly and the tape in the area of the pattern.

* * * * *